US008843799B2

(12) United States Patent
Wang et al.

(10) Patent No.: US 8,843,799 B2
(45) Date of Patent: Sep. 23, 2014

(54) SERIAL PROCESSING METHOD, PARALLEL PROCESSING METHOD OF BIT RATE MATCHING AND DEVICE THEREOF

(75) Inventors: Weitao Wang, Shenzhen (CN); Shouhong Zhen, Shenzhen (CN)

(73) Assignee: ZTE Corporation, Shenzhen, Guangdong (CN)

( * ) Notice: Subject to any disclaimer, the term of this patent is extended or adjusted under 35 U.S.C. 154(b) by 144 days.

(21) Appl. No.: 13/393,298

(22) PCT Filed: Sep. 28, 2010

(86) PCT No.: PCT/CN2010/077389
§ 371 (c)(1),
(2), (4) Date: Feb. 29, 2012

(87) PCT Pub. No.: WO2011/079633
PCT Pub. Date: Jul. 7, 2011

(65) Prior Publication Data
US 2012/0185751 A1    Jul. 19, 2012

(30) Foreign Application Priority Data

Jan. 4, 2010  (CN) .......................... 2010 1 0000107
Jan. 6, 2010  (CN) .......................... 2010 1 0002208

(51) Int. Cl.
*H03M 13/00* (2006.01)
*H04L 1/00* (2006.01)
*H03M 13/27* (2006.01)

(52) U.S. Cl.
CPC ........ *H03M 13/271* (2013.01); *H03M 13/6561* (2013.01); *H03M 13/2792* (2013.01); *H04L 1/0071* (2013.01); *H03M 13/635* (2013.01); *H04L 1/0068* (2013.01); *H03M 13/6525* (2013.01)
USPC .......................................... 714/752; 714/786

(58) Field of Classification Search
CPC . H04L 1/0013; H04L 1/0067; H03M 13/2957
See application file for complete search history.

(56) References Cited

U.S. PATENT DOCUMENTS 6,397,367 B1 * 5/2002 Park et al. ...................... 714/786
7,251,285 B2 * 7/2007 Lee et al. ....................... 375/262
(Continued)

FOREIGN PATENT DOCUMENTS

CN    101090293 A    12/2007
CN    101510819 A    8/2009

OTHER PUBLICATIONS

Extended European Search Report for PCT/CN2010/077389, Completed by the European Patent Office, Dated Jan. 2, 2014, 13 Pages.
Hwang et al. IEEE Wireless Communications and Networking Conference Apr. 18, 2010, 6 Pages, XP 031706374, "Implementation of an Encoder based on Parallel Structure for LTE Systems."
Nokia Siemens Networks, Nokia, 3GPP TSG-RAN Working Group 1 #49 May 7-11, 2007, XP 050105999, 3 Pages, "Discussion of Parallel Implementation of UTRAN Rate Matching."

(Continued)

*Primary Examiner* — Steve Nguyen
(74) *Attorney, Agent, or Firm* — Brooks Kushman P.C.

(57) ABSTRACT

A serial processing method and a parallel processing method of bit rate matching and apparatuses thereof are disclosed in the present invention. The serial processing method includes: receiving a system bit data stream, a check 1 data stream and a check 2 data stream, performing interleaving processing on the system bit data in the received system bit data stream, and caching in a first buffer cache of a storage; simultaneously performing interleaving processing on the corresponding data in the received check 1 data stream and the received check 2 data stream, and caching the data on which the performing interleaving processing is performed in a second buffer of the storage; and reading valid data from the storage and implementing the rate matching.

8 Claims, 4 Drawing Sheets

(56) References Cited

U.S. PATENT DOCUMENTS

| | | | | |
|---|---|---|---|---|
| 7,823,040 | B2* | 10/2010 | Cheng | 714/751 |
| 7,924,763 | B2* | 4/2011 | Nimbalker et al. | 370/315 |
| 7,986,741 | B2* | 7/2011 | Tsai et al. | 375/261 |
| 8,189,559 | B2* | 5/2012 | Pi et al. | 370/351 |
| 8,495,467 | B1* | 7/2013 | Billing et al. | 714/764 |
| 8,537,909 | B2* | 9/2013 | Kim et al. | 375/260 |
| 8,555,133 | B2* | 10/2013 | Cho et al. | 714/755 |
| 8,560,910 | B2* | 10/2013 | Takaoka et al. | 714/752 |
| 2008/0109618 | A1 | 5/2008 | Kim et al. | |
| 2008/0301536 | A1* | 12/2008 | Shin et al. | 714/786 |
| 2009/0049359 | A1* | 2/2009 | Malladi et al. | 714/752 |
| 2009/0052473 | A1 | 2/2009 | Choi et al. | |

OTHER PUBLICATIONS

Cheng et al. IEEE 68th Vehicular Technology Conference Sep. 21, 2008, XP 031352345, 5 Pages, "Analysis of Circular Buffer Rate Matching for LTE Turbo Code."

Ma et al. IEEE Proc. 2nd International Conference on Future Computer and Commmunication May 21, 2010, XP 031698733, p. 704-707, "Efficient Implementation of Rae Matching for LTE Turbo Codes."

International Search Report for PCT/CN2010/077389, English translation attached to original, Both completed by the Chinese Patent Office on Dec. 19, 2010, All together 8 Pages.

* cited by examiner

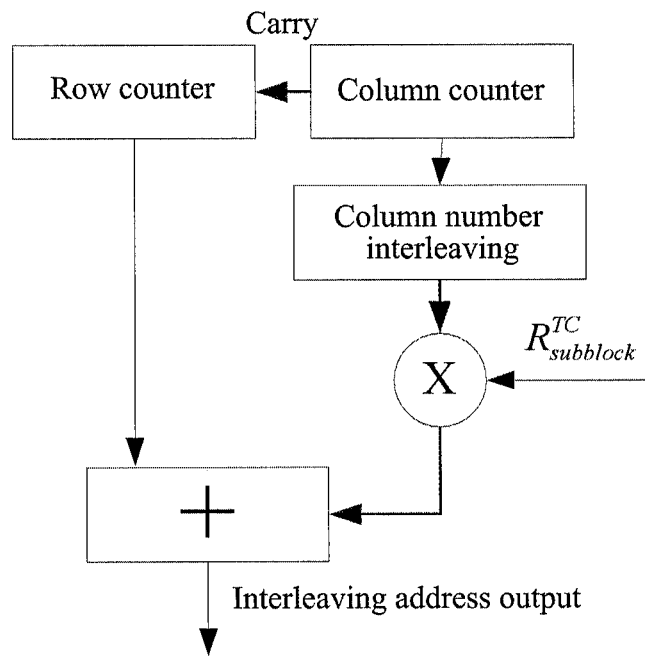

FIG. 3

| The apparatus for matching bit rate receives the system bits data stream, check 1 data stream and check 2 data stream, and performs interleaving processing on the system bits data stream according to the interleaving formula, and simultaneously performs interleaving processing on the corresponding data in the check 1 data stream and check 2 data stream according to the interleaving formula | 401 |

| The apparatus for matching bit rate stores the system bits data after interleaving processing into the first R*32 positions in the storage, takes the check 1 data stream and check 2 data stream after interleaving processing as one data to store in the position behind the R*32 positions for storing the system data in the storage | 402 |

| The apparatus for matching bit rate takes out the data according to the parameter for judging and tailoring | 403 |

FIG. 4

SERIAL PROCESSING METHOD, PARALLEL PROCESSING METHOD OF BIT RATE MATCHING AND DEVICE THEREOF

CROSS-REFERENCE TO RELATED APPLICATION

This application is the U.S. national phase of PCT Appln. No. PCT/CN2010/077389 filed Sep. 28, 2010 which claims priorities to Chinese Application Nos. 201010000107.8 filed Jan. 4, 2010 and 201010002208.9 filed Jan. 6, 2010, the disclosures of which are incorporated in their entirety by reference herein.

TECHNICAL FIELD

The present invention relates to the channel coding part in the mobile communication system, and specifically, to a serial processing method and a parallel processing method of bit rate matching and apparatuses thereof.

BACKGROUND OF THE RELATED ART

In the mobile communication system, the data transferred in the channel will generate some redundant data after the channel coding, and the redundant information is used to provide more decoding information for the decoder to improve the success ratio of decoding, however a decreasing of transfer efficiency will be caused if all of the redundant information is transferred. Therefore, at present, a preferred method is to select the amount of the transfer information according to the quality of the channel, for example only the original information is transferred when the channel quality is better, whereas more check bits are transferred with the original information bits when the channel quality is not that good. That is, it is needed to select the transferred data generated by the channel coder to transfer, and the rate matching is to implement the function of selecting the transferred coding data.

Nowadays, a method for matching rates—cyclic buffer rate matching, that is totally different from the R6, is adopted in the Long Term Evolution (LTE) system. The advantage of the algorithm is that the repeating and puncturing can be implemented conveniently, that is, the implementation of the rate matching at any data rate is very simple, wherein the main ways for implementing the rate matching include software implementation ways and hardware implementation ways. Since the amount of the data traffic in the LTE system is very large, the time maintained for processing the rate matching is very short, and if the way of software implementation is used, the requirements for the processor are very high, and the costs therewith are increased dramatically. If hardware processing is performed according to the steps described in the protocol, the coded data are interleaved and stored in three storages and then are tailored, especially, interleaved-reading is required when processing the data in the check 1 storage and check 2 storage, which is very complicated and a lot of power consumption will be produces during the constant conversion process of the address.

Therefore, further improvements are made to the existing implementation technology.

For example, the existing rate matching includes operations of intra-block interleaving, and collection, selection, and transmission of bits and so on, the principle of which is shown in FIG. 1, wherein the input data streams $d_k^{(0)}$, $d_k^{(1)}$ and $d_k^{(2)}$ respectively correspond to the system bit S, the first parity check bit P1 (or may be called check 1 briefly) and the second parity check bit P2 (or may be called check 2) output by the Turbo coder. According to the flow direction shown in FIG. 1, the interleaving processing has been performed on the system bit, check 1 and check 2 respectively at first, while the intra-block interleaving processed $v_k^{(0)}$, $v_k^{(1)}$ and $v_k^{(2)}$ are collected into the virtual buffer sequence $w_k$ in accordance with specified rules, wherein the data in the virtual buffer is read according to the initial position and the size of the soft buffer (NCB), wherein the data in the system bit buffer are read in sequence, and the data in the check bit buffer are read in an interleaved way, and it is judged whether the read data are valid data, and if the read data are invalid data, the read data are neglect and it is continued to read, or else, the valid data are output.

The existing rate matching process is described in detail as follows, wherein the numbers of row and column interleavers and indexes of various data are all numbered from 0, and the input three data streams $d_k^{(0)}$, $d_k^{(1)}$ and $d_k^{(2)}$ have equal length. It is assumed that the lengths of the three data streams are D, and then the input data sequence is $d_0^{(i)}, d_1^{(i)}, d_2^{(i)}, \ldots, d_{D-1}^{(i)}$, wherein i equals to 0, 1, and 2, which respectively correspond to the system bit S, check bit P1 and check bit P2.

Step 1: The Number of Required Rows and the Number of Dummy Bits are Calculated.

Since the number of columns C of the intra-block interleaver is set to 32 invariably, the number of rows R of the intra-block interleaver is $$R = \left\lceil \frac{D}{C} \right\rceil.$$

When R×C>D, extra dummy bits require padding, and the number of dummy bits ND is:

$$ND = (R \times C - D).$$

Step 2: The Dummy Bits and Data Streams are Written.

The dummy bits are written into the interleaver by rows at first, and then the data stream $d_k^{(i)}$ is written into the interleaver by rows, and an R×C matrix is constituted as follows:

$$\begin{bmatrix} y_0 & y_1 & y_2 & \cdots & y_{C-1} \\ y_C & y_{C+1} & y_{C+2} & \cdots & y_{2C-1} \\ \vdots & \vdots & \vdots & \ddots & \vdots \\ y_{(R-1)\times C} & y_{(R-1)\times C+1} & y_{(R-1)\times C+2} & \cdots & y_{(R\times C-1)} \end{bmatrix}$$

wherein $$y_k = \begin{cases} \langle NULL \rangle & k < N_D \\ d_{k-N_D}^i & k \geq N_D \end{cases}$$

Step 3: Column Transposition is Performed and Data are Read.

The LTE adopts interleavers with different parameters for different data streams, which is described respectively below.

Sub-Interleaver 1

The column numbers of the R×C matrix are $0, \ldots, C-1$. Column transposition is performed on $\langle P(j) \rangle_{j \in \{0, 1, \ldots, C-1\}}$ according to the transposition pattern shown in FIG. 1, that is, P(j) is the column number of the $j^{th}$ column before the transposition.

TABLE 1 is an inter-column interleaving pattern table

| Column transposition pattern <P(0), P(1), ... , P(C − 1)> |
| --- |
| <0, 16, 8, 24, 4, 20, 12, 28, 2, 18, 10, 26, 6, 22, 14, 30, 1, 17, 9, 25, 5, 21, 13, 29, 3, 19, 11, 27, 7, 23, 15, 31> |

The matrix after the column transposition is as follows:

$$\begin{bmatrix} y_{P(0)} & y_{P(1)} & y_{P(2)} & \cdots & y_{P(C-1)} \\ y_{P(0)+C} & y_{P(1)+C} & y_{P(2)+C} & \cdots & y_{P(C-1)+C} \\ \vdots & \vdots & \vdots & \ddots & \vdots \\ y_{P(0)+(R-1)\times C} & y_{P(1)+(R-1)\times C} & y_{P(2)+(R-1)\times C} & \cdots & y_{P(C-1)+(R-1)\times C} \end{bmatrix}$$

The above matrix is output by columns to obtain an output sequence $v_0^{(i)}, v_1^{(i)}, v_2^{(i)}, \ldots, v_{K_\Pi-1}$, wherein $v_0^{(i)}$ corresponds to $y_{P(0)}$, $v_1^{(i)}$ corresponds to $y_{P(0)+C}$, and $K_\Pi = (R \times C)$.

Sub-Interleaver 2

The existing sub-interleaver 2 is a result of 1 bit offset of sub-interleaver 1. Therefore, it is easy to obtain from the above analysis that the corresponding relationship between the output and the input of sub-interleaver 2 is:

$$\pi(k) = \left( P\left(\left\lfloor \frac{k}{R} \right\rfloor\right) + C \times (k \bmod R) + 1 \right) \bmod K_\Pi$$

Step 4: Bits Collection.

A cyclic buffer with a size of $3K_\Pi$ is defined, and then the three data on which the interleaving processing is performed are collected as a following method.

$$w_k \begin{cases} v_k^{(0)} & k = 0, 1, \ldots, K_\Pi - 1 \\ v_{(k-K_\Pi)/2}^{(1)} & k = K_\Pi, K_\Pi + 2, \ldots, 3 \times K_\Pi - 2 \\ v_{(k-K_\Pi-1)/2}^{(2)} & k = K_\Pi + 1, K_\Pi + 3, \ldots, 3 \times K_\Pi - 1 \end{cases}$$

Step 5: The Length of the Bit Sequence Output after the Rate Matching is Calculated.

Four parameters are needed in the calculation in this step, which are respectively:

1) G—the sum of the number of bits of all of the code blocks output after the rate matching, that is, the number of bits that a transport block is able to transfer;

2) M—modulation ways, which is QPSK, 16 QAM or 64 QAM;

3) C—the number of code blocks;

4) r—the index of the present code block, the numbers of which are 0, . . . C−1.

The calculation of the length of the sequence output after the rate matching is as follows:

$$Q_m = \begin{cases} 2 & \text{for } M = QPSK \\ 4 & \text{for } M = 16QAM \\ 6 & \text{for } M = 64QAM \end{cases}$$

$G' = G/Q_m$

Let $\gamma = G' \bmod C$, and the calculation of E is as follows:

if $r \leq C - \gamma - 1$ $E = Q_m \cdot \lfloor G'/C \rfloor;$ else $E = Q_m \cdot \lceil G'/C \rceil;$ end Step 6: The Selection and Deletion of Data.
The initial position $k_0 = R \times (24 \times RV_{idx} + 2)$.
Let k=0, j=0 while (k<E)

if $w_{(k_0+j) \bmod K_w} \neq <NULL>$ $e_k = w_{(k_0+j) \bmod K_w};$ k=k+1;

end j=j+1;

end wherein $K_w = 3 \times K_\Pi$, and <NULL> is common term for the padding bits added during dividing the code block and the dummy bits added during the interleaving of the code block.

The existing implementation schemes are all based on the description in TS36.212: first interleaved-storing the system bit, check 1 and check 2 in three storages, and then reading data from the system bit storage according the parameter configuration, or interleaved-reading data from check 1 and check 2 storages, and then tailoring the data.

It can be seen from above that three storages are needed in the related art, and it is needed to distinguish whether the data to be stored are system bit data or check 1 data or check 2 data in the storing process. Besides, in the related art, the boundary of the storage needs to be judged at each time, and the address multiplexing is needed, and therefore, the system is complex with large power consumption.

SUMMARY OF THE INVENTION

The technical problem to be solved in the present invention is to provide a serial processing method and a parallel processing method of bit rate matching and apparatuses thereof, so as to solve the problem of storage complexity in the process of the bit collection of bit rate matching and improve the throughput of the system.

In order to solve the above problem, the present invention discloses a serial processing method of bit rate matching, comprising:

receiving a system bit data stream, a check 1 data stream and a check 2 data stream, performing interleaving processing on system bit data in the received system bit data stream to cache in a first buffer of a storage; simultaneously performing interleaving processing on corresponding data in the received check 1 data stream and the check 2 data stream, and caching the data on which the interleaving processing is performed simultaneously in a second buffer of the storage; and reading valid data from the storage, and implementing the rate matching.

In the above serial processing method, the corresponding data in the received check 1 data stream and the check 2 data stream refer to: a first data to a last but one data in the check 1 data stream respectively corresponding to a second data to a last data in the check 2 data stream, a last data in the check 1 data stream corresponding to a NULL padded in the check 2 data stream, and a first data in check 2 data stream corresponding to a NULL padded in the check 1 data stream.

In the above serial processing method, the step of simultaneously performing interleaving processing on the corresponding data in the received check 1 data stream and the check 2 data stream comprises: simultaneously performing interleaving processing on various data in the check 1 data stream and the corresponding data in the check 2 data stream according to a receiving order, simultaneously performing interleaving processing on the last data in the check 1 data stream and the corresponding padded NULL thereof, and simultaneously performing interleaving processing on the first data in the check 2 data stream and the corresponding padded NULL thereof.

In the above serial processing method, the step of reading valid data from the storage comprises: circularly reading valid data from the storage in sequence according to a set address and a length of output data, wherein valid system bit data are read from the first buffer of the storage in sequence, and valid check data are read from the second buffer of the storage in sequence.

In the above serial processing method, the storage is a real dual-port storage.

The present invention further discloses a serial processing apparatus of bit rate matching, comprising a controlling module, an interleaving address calculating module and a puncturing module, wherein:

the controlling module is configured to: input a received system bit data stream to the interleaving address calculating module for interleaving processing, and cache the system bit data stream in a first buffer; and simultaneously input corresponding data in a received check 1 data stream and a check 2 data stream to the interleaving address calculating module for interleaving processing, and cache the check 1 data stream and the check 2 data stream in a second buffer;

the interleaving address calculating module is configured to: perform interleaving processing on system bit data in the system bit data stream according to control of the controlling module, and simultaneously perform interleaving processing on the corresponding data in the simultaneously input check 1 data stream and the check 2 data stream;

the puncturing module is configured to: read valid data from the storage, and implement the rate matching.

In the above serial processing apparatus, the corresponding data in the received check 1 data stream and the check 2 data steam refer to: a first data to a last but one data in the check 1 data stream respectively corresponding to a second data to a last data in the check 2 data stream, a last data in the check 1 data stream corresponding to a NULL padded in the check 2 data stream, and a first data in check 2 data stream corresponding to a NULL padded in the check 1 data stream.

In the above serial processing apparatus, the controlling module is also configured to: simultaneously input various data in the check 1 data stream and a corresponding check 2 data into the interleaving address calculating module according a receiving order, simultaneously input the last data in the check 1 data stream and the corresponding NULL padded in the check 2 data stream into the interleaving address calculating module, and simultaneously input the first data in the check 2 data stream and the corresponding NULL thereof into the interleaving address calculating module.

In the above serial processing apparatus, the puncturing module is also configured to: circularly read valid data from the storage in sequence according a set address and a length of output data, wherein valid system bit data are read from the first buffer of the storage in sequence, and valid check data are read from the second buffer of the storage in sequence. In the above serial processing apparatus, the storage is a real dual-port storage.

In order to solve the above problem, the present invention further discloses a parallel processing method of bit rate matching, comprising:

receiving a system bit data stream, a check 1 data stream and a check 2 data stream, performing interleaving processing on N system bit data in the received system bit data stream, and caching the N system bit data in a storage used for storing the system bit data in parallel, performing interleaving processing on N corresponding data groups in the check 1 data stream and the check 2 data stream, and caching the N corresponding data groups in a storage used for storing the check bit data in parallel, wherein N is equal to a preset parallelism degree; and reading valid data from the storage used for storing the system bit data and the storage used for storing the check bit data, and implementing the rate matching.

In the above parallel processing method, the corresponding data group in the check 1 data stream and the check 2 data stream refers to: a first data to a last but one data in the check 1 data stream respectively constituting corresponding data groups with a second data to a last data in the check 2 data stream, a last data in the check 1 data stream constituting a corresponding data group with a NULL padded in the check 2 data stream, and a first data in the check 2 data stream constituting a corresponding data group with a NULL padded in the check 1 data stream.

In the above parallel processing method, the step of performing interleaving processing on N corresponding data groups in the check 1 data stream and the check 2 data stream comprises: respectively constituting various data in the check 1 data stream and various data in the check 2 data stream into corresponding data groups according to a receiving order of various data in the check 1 data stream, and performing interleaving processing on N corresponding data groups in all of the constituted corresponding data groups, until all of the corresponding data groups are processed, wherein each corresponding data group is regarded as one data for interleaving processing.

In the above parallel processing method, the step of reading valid data from the storage used for storing the system bit data and the storage used for storing the check bit data comprises: according to a set address and a length of output data, reading valid system bit data in parallel from the storage used for storing the system bit data, and reading valid check bit data in parallel from the storage used for storing the check bits data.

In the above parallel processing method, when the storage used for storing system bit data is a single port storage, a number of the storages used for storing the system bit data is equal to a set parallelism degree; when the storage used for storing the system bit data is a real dual-port storage, a number of the storages used for storing the system bit data is equal to one half of the set parallelism degree.

In the above parallel processing method, when the storage used for storing check data is a single port storage, a number of the storages used for storing the check data is equal to a set parallelism degree; when the storage used for storing check data is a real dual-port storage, a number of the storages used for storing the check bits data is equal to one half of the set parallelism degree.

The present invention further discloses a parallel process apparatus of bit rate matching, comprising a controlling module, N interleaving address calculating modules and a puncturing module, wherein N is equal to a preset parallelism degree; wherein the controlling module is configured to: control the N interleaving address calculating modules to perform interleaving processing on N system bit data in a received system data stream, and cache the N system bit data on which the interleaving processing is performed in a storage used for storing system bit data in parallel; and control the N interleaving address calculating modules to perform interleaving processing on N corresponding data groups in received check 1 data stream and check 2 data stream, and cache the N corresponding data groups on which the interleaving processing is performed in a storage used for storing check data in parallel;

the interleaving address calculating module is configured to: perform interleaving processing on system bit data according to control of the controlling module, and perform interleaving processing on the corresponding data groups in the check 1 data stream and check 2 data stream;

the puncturing module is configured to: read valid data from the storage used for storing the system bit data and the storage used for storing the check data, and implement the rate matching.

In the above parallel processing apparatus, the corresponding data group in the check 1 data stream and the check 2 data stream refers to: a first data to a last but one data in the check 1 data stream respectively constituting corresponding data groups with a second data to a last data in the check 2 data stream, a last data in the check 1 data stream constituting a corresponding data group with a NULL padded in the check 2 data stream, and a first data in the check 2 data stream constituting a corresponding data group with a NULL padded in the check 1 data stream.

In the above parallel processing apparatus, the controlling module is also configured to: respectively constitute various data in the check 1 data stream and various data in the check 2 data stream into corresponding data groups according to a receiving order of various data in the check 1 data stream, and input N corresponding data groups in all of the constituted corresponding data groups into N interleaving address calculating modules for performing interleaving processing, until all of the corresponding data groups are processed;

the interleaving address calculating module is also configured to: take each corresponding data group input by the controlling module as one data for interleaving processing.

In the above parallel processing apparatus, the puncturing module is also configured to: read valid system bit data in parallel from the storage used for storing the system bit data, and read valid check data in parallel from the storage used for storing the check data.

In the above parallel processing apparatus, when the storage used for storing the system bit data is a single port storage, a number of the storages used for storing the system bit data is equal to a set parallelism degree; when the storage used for storing the system bit data a dual-port storage, a number of the storages used for storing the system bit data is equal to one half of the set parallelism degree.

In the above parallel processing apparatus, when the storage used for storing the check data is a single port storage, a number of the storages used for storing the check data is equal to a set parallelism degree; when the storage used for storing the check data is a dual-port storage, a number of the storages used for storing the check data is equal to one half of a set parallelism degree.

Compared with the existing bit rate matching scheme, the technical scheme of the present invention implements the interleaving storage when storing the check 1 data stream and check 2 data stream, thereby simplifying the storage structure and decreasing the system complexity.

Furthermore, the serial processing of bit rate matching according to the technical scheme of the present invention uniformly stores the system bit data and the check data, and reading the data in parallel thus is very easy, which facilitates the implementation of the puncturing in parallel and improves the processing rate of the rate matching. In addition, since the storage interfaces are decreased in the present scheme, the implementation steps of the hardware are simplified, the power consumption and area are saved, and costs are reduced; the parallel processing of bit rate matching according to the technical scheme of the present invention improves the system processing capability.

BRIEF DESCRIPTION OF DRAWINGS

FIG. 3 is a block diagram of the interleaving address calculating module in the processing apparatus of bit rate matching provided in the present invention;

FIG. 4 is a flowchart of implementing the bit rate matching by the apparatus shown in FIG. 2;

PREFERRED EMBODIMENTS OF THE PRESENT INVENTION

The main idea of the present invention is that: in the existing rate matching technology, the ways for generating the interleaving addresses of the system data stream and check 1 data stream are the same, as shown in formula (1), while the formula for generating the interleaving addresses of check 2 data stream is as shown in formula (2):

$$\pi(k) = \left(P\left(\left\lfloor \frac{k}{R^{TC}_{subblock}} \right\rfloor\right) + C^{TC}_{subblock} \times (k \bmod R^{TC}_{subblock})\right) \bmod K_\Pi \quad \text{formula (1)}$$

$$\pi(k) = \left(P\left(\left\lfloor \frac{k}{R^{TC}_{subblock}} \right\rfloor\right) + C^{TC}_{subblock} \times (k \bmod R^{TC}_{subblock}) + 1\right) \bmod K_\Pi \quad \text{formula (2)}$$

Comparing these two interleaving formulas, it can be seen that the input data matrix of formula (2) is shifted to the right by one relative to the formula (1), therefore, the present invention considers that the input data of the check 2 data stream are shifted to the left by one (that is, the first data in the check 2 data stream is shifted into the last position), and thus, the way for generating the interleaving address of the check 2 data stream is totally the same as the way for generating the interleaving addresses of the system bit data stream and the check 1 data stream, thereby being able to use one interleaving address generation device in common. Besides, the interleaving address of the check 2 data is totally the same as the interleaving address of the check 1 data at every time, which makes the interleaved storage of check 1 and check 2 to be implemented during the storing process, and therefore, just the check data are read in sequence when reading the data.

The technical scheme of the present invention will be further described in detail in combination with drawings and specific embodiments.

Figure 2:
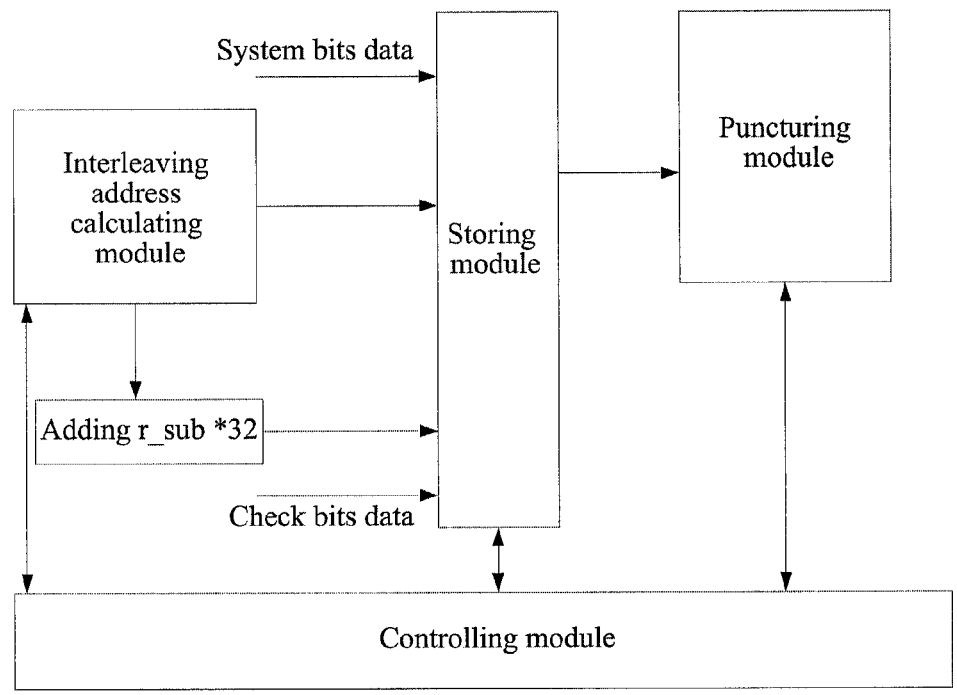
FIG. 2 is a schematic diagram of the structure of the serial processing apparatus of bit rate matching provided in the present invention.

Firstly, for the system with a smaller throughput, the present invention provides a serial processing apparatus used for bit rate matching, and as shown in FIG. 2, the apparatus at least comprises an interleaving address calculating module, a storing module, a puncturing module and a controlling module. The function of each module will be described as follows.

The controlling module is mainly used to: control the work states of the interleaving address calculating module, the storing module, and the puncturing module, wherein the controlling module controls the interleaving address calculating module to perform interleaving processing on the input system bit data stream, and stores the interleaving-processed system bit data into the buffer used for storing the system bit data; the controlling module inputs the corresponding data in the check 1 data stream and check 2 data stream into the interleaving address calculating module simultaneously, and controls the interleaving address calculating module to perform interleaving processing on the simultaneously received corresponding data at the same time, and stores each of the simultaneously interleaving-processed data in the check 1 data stream and each of its corresponding data in the check 2 data stream into the buffer used for storing the check data in the storage according to the address generated by the interleaving address calculating module, wherein the two corresponding data that are simultaneously performed by the interleaving processing are taken as one data in an order of the check 1 data before the check 2 data to be stored into the buffer used for storing the check data. Finally, the controlling module may control the puncturing module, and read the valid data in parallel from the storage.

The corresponding data in the above check 1 data stream and check 2 data stream refer to:

the first data to the last but one data in check 1 data stream respectively corresponding to the second data to the last data in check 2 data stream one to one, the last data in the check 1 data stream corresponding to the NULL padded in the check 2 data stream, and the first data in check 2 data stream corresponding to the NULL padded in the check 1 data stream.

In this embodiment, the controlling module may cache the first data in the check 2 data stream after receiving the check 1 data stream and check 2 data stream, and simultaneously input the received first data in the check 1 data stream and the second data in the check 2 data stream corresponding to the first data in the check 1 data stream into the interleaving address calculating module for interleaving processing, and the like, and simultaneously input all of the second data to the last but one data in the check 1 data stream and their corresponding third data to the last data in the check 2 data stream into the interleaving address calculating module, wherein these one-to-one corresponding data are input into the interleaving address calculating module in sequence according to the receiving order of each data in check 1 data stream; then the controlling module simultaneously inputs the last data in the check 1 data stream and its corresponding NULL padded in the check 2 data stream into the interleaving address calculating module, and further simultaneously inputs the cached first data in the check 2 data stream and its corresponding NULL padded in the check 1 data stream into the interleaving address calculating module; the NULL padded in the check 1 data stream and the check 2 data stream are padded NULL after completing to receive the data.

The interleaving address calculating module is mainly used to calculate the interleaving address for the data input by the controlling module, wherein the interleaving address calculating module performs interleaving processing by taking the corresponding data groups in the check 1 data stream and in the check 2 data stream input by the controlling module as one data.

Specifically, the interleaving address calculating module, as shown in FIG. 3, may transpose the column numbers based on the protocol interleaving transposition table according to the row and column information corresponding to each input data at first, and then multiply the result of column interleaving transposition and the total number of rows of the matrix, and finally sum the result of multiplying the result of column interleaving transposition and the total number of rows of the matrix and the row number where the data is situated to obtain the interleaving address.

The storing module is mainly configured to store the data according to the interleaving address. The storing module in the present embodiment adopts real dual ports RAM, wherein the system bit data are stored in the low address part of the RAM, and the write-in bit-width of the system bits is 2 bits; the data of check 1 and check 2 are taken as one data to be stored with the 4 bits storage data bit-width, which is equivalent to complete the data interleaving and generation of soft buffer in one step.

The puncturing module is mainly used to take out the number parameter configuration according to the initial parameter and end parameter, read the data from the storage and judge whether the read data are invalid data or not, if yes, delete the invalid data, or else, output the data, if the taken data is still not enough when reading data reaches the end parameter position, then continue to read data from the first position of the storage until taking out enough required data.

The specific process of the serial process for implementing the bit rate matching by the above serial processing apparatus of bit rate matching will be described as follows, and the process is as shown in FIG. 4, comprises the following steps.

Step 401: the serial apparatus of bit rate matching receives the system bit data stream, check 1 data stream and check 2 data stream, and performs interleaving processing on the system bit data stream according to the interleaving formula, and simultaneously performs interleaving processing on the corresponding data in the check 1 data stream and check 2 data stream according to the interleaving formula.

In this step, the corresponding data in the check 1 data stream and check 2 data stream refer to: the first data to the last but one data in check 1 data stream respectively corresponding to the second data to the last data in check 2 data stream one to one, the last data in the check 1 data stream corresponding to the NULL padded in the check 2 data stream, and the first data in check 2 data stream corresponding to the NULL padded in the check 1 data stream.

In this embodiment, the received check 1 data stream and check 2 data stream may be cached respectively and then be processed, that is, buffer 1 and buffer 2 may be allocated for the check 1 data stream, and a cache and a buffer 1 may be allocated for the check 2 data stream; the received check 1 data go into the buffer 1 firstly and then go into buffer 2, the first data in the received check 2 data stream is cached in the cache, the data starting from the second data in the received check 2 data stream all go into the buffer 1, and thus, the data in the buffer 2 of the check 1 data stream and the data in the buffer 1 of the check 2 data stream are corresponding data; then interleaving processing can be just performed on the corresponding data simultaneously according to the interleaving formula, and when there are no more data cached in the buffer 1 of the check 2 data stream (that is, all of the data of the check 2 data stream are all received), it is started to pad the set number of NULLs for the check 2 data stream, at this point, the data in the buffer 1 of the check 1 data stream (i.e., the last data in the received check 1 data stream) correspond to the NULLs padded in the check 2 data stream, and interleaving processing can be just performed on the corresponding data simultaneously according the interleaving formula; after performing interleaving processing on the last data of the check 1 data stream and the corresponding NULL thereof, it is started to pad the set number of NULLs for the check 1 data stream; when the number of the NULLs padded for the check 1 data stream reaches a set value (that is, when padding the last NULL), the data (namely the first data in the received check 2 data stream) cached in the cache correspond to the NULLs padded in the check 1 data stream, and interleaving processing is performed on the corresponding data simultaneously according to the interleaving formula.

Step 402: the serial apparatus of bit rate matching stores the system bit data after interleaving processing into the first R*32 positions (or called as the first buffer of the storage, which is dedicated for storing the system data) of the storage, takes the check 1 data stream and check 2 data stream after interleaving processing as one data to store in the positions behind the R*32 positions that are used for storing the system bit data in the storage (that is, when the check data are stored in the same storage, an offset address R_sub*32 should be added to the storage address, and the buffer used for storing the check data may be called as the second buffer of the storage).

In this step, the serial apparatus of bit rate matching taking the check 1 data stream and check 2 data stream after interleaving processing as one data to store in the second buffer of the storage refers to: the serial apparatus of bit rate matching stores the corresponding data in the check 1 data stream and check 2 data stream on which the interleaving processing is performed simultaneously as one data in the second buffer of the storage, wherein the corresponding data on which the interleaving processing is performed are taken as one data in an order of the check 1 data before the check 2 data to be stored in the second buffer.

Step 403: the serial apparatus of bit rate matching takes out the data according to the parameter for judging and tailoring.

In this step, the serial apparatus of bit rate matching reads data from the storage according the system required initial position and length of output data, and if the read data is NULL, does not output the data and does not increase the number of the output data; if the read data is not NULL, outputs the data and increases the number of the output data. If the taken data is still not enough when the reading the data at the end NCB position of the soft buffer, then continues to read data from the initial position of the soft buffer until obtaining enough data.

It can be seen from the above embodiment that the technical scheme of the present invention solves the problem of storage complexity in the process of bit collection of the bit rate matching, and facilitates the subsequent tailoring processing and decreased the system complexity, saves the chip area and power consumption, enables the system bits, check 1 and check 2 to be processed uniformly and to use the interleaving generation apparatus in common, which saves one interleaving address generation apparatus and saves the area and power consumption of the rate matching apparatus.

Figure 5:
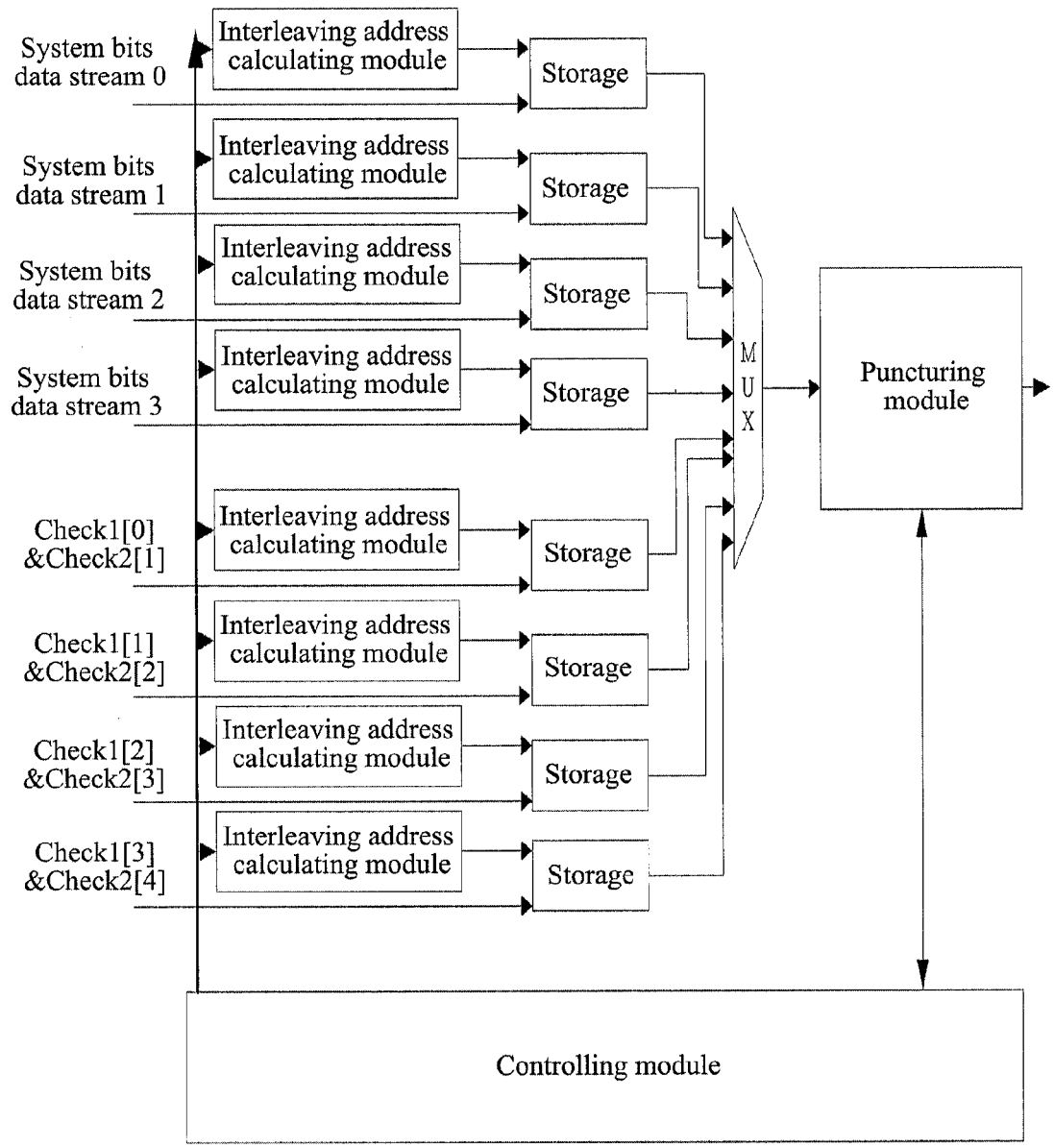
FIG. 5 is a schematic diagram of the structure of the parallel processing apparatus of bit rate matching provided in the present invention.

Secondly, for the system with a larger throughput, the present invention also provides a parallel processing apparatus of bit rate matching, and as shown in FIG. 5, the parallel apparatus at least comprises N serial interleaving address calculating modules, a storing module used for storing the system bit data, a storing module used for storing the check data, a puncturing module and a controlling module, wherein N is equal to the preset parallelism degree. The functions of each module will be described as follows.

The controlling module is mainly used to control the work states of the interleaving address calculating modules, the storing module for storing system bit data, the storing module for storing the check data, and the puncturing module, wherein the controlling module simultaneously inputs the N data (in this embodiment, N data refer to the system bit data streams 0, 1, 2 and 3 shown in FIG. 5) in the received system bits data stream into the N parallel interleaving address calculating modules, controls the N parallel interleaving address calculating modules to simultaneously perform interleaving processing on the input system bit data (that is, controls the interleaving address module to generate addresses for the input system bit data), the controlling module also controls to store the N system bit data on which the interleaving processing is performed simultaneously in the storage used for storing the system bit data in parallel according to the addresses generated by the respective interleaving address calculating module; and used to simultaneously input the received N corresponding data groups in the check 1 data stream and check 2 data stream into the N parallel interleaving address calculating modules, to control the N parallel interleaving address calculating modules to simultaneously perform interleaving processing on the input corresponding data groups (that is, to control the interleaving address calculating modules to generate addresses for the input system bits data), and to store the N corresponding data groups that are simultaneously performed by the interleaving processing in the storage used for storing the check data in parallel, wherein each corresponding data group that are simultaneously performed by the interleaving processing are stored as one data in an order of the check 1 data before the check 2 data. Finally, the controlling module may control the puncturing module, and read the valid data from the storing module.

The corresponding data in the above check 1 data stream and check 2 data stream refer to:

the first data to the last but one data in check 1 data stream constituting the corresponding data with the second data to the last data in check 2 data stream respectively, the last data in the check 1 data stream constituting the corresponding data with the NULL padded in the check 2 data stream, and the first data in check 2 data stream constituting the corresponding data with the NULL padded in the check 1 data stream.

The interleaving address calculating module is mainly used to calculate the interleaving address of the data input by the controlling module, wherein the interleaving address calculating module takes the corresponding data group in the check 1 data stream and the check 2 data stream input by the controlling module as one data to perform the interleaving processing.

Specifically, the interleaving address calculating module, as shown in FIG. 3, may transpose the column numbers based on the protocol interleaving transposition table according to the row and column information corresponding to each input data at first, and then multiply the result of column interleaving transposition and the total number of rows of the matrix, and finally sum the result of multiplying the result of column interleaving transposition and the total number of rows of the matrix and the row number where the data is situated to obtain the interleaving address.

Figure 1:
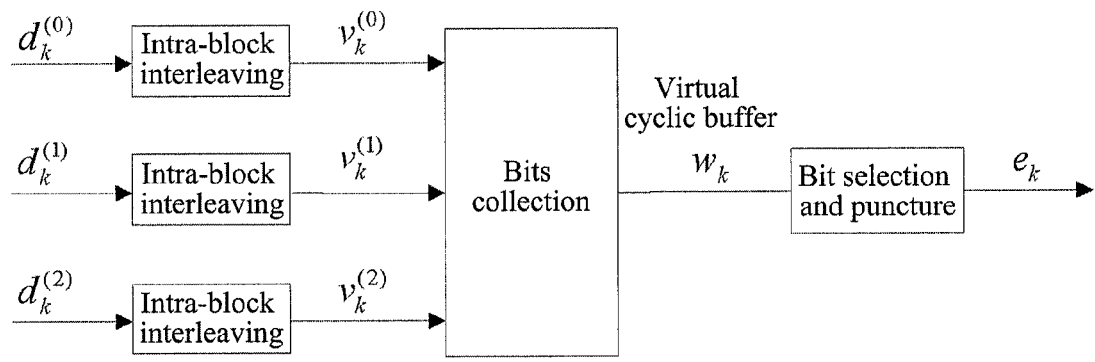
FIG. 1 is a block diagram of the principle of bit rate matching in the related art.

In this embodiment, at least N, that is equal to the parallelism degree, interleaving address calculating modules should be set according to the parallelism degree, and the interleaving address calculating modules respectively calculate the interleaving address of each data input in parallel, wherein the parallelism degree refers to the number of data of $d_k^{(i)}$ input in the interleaving address calculating module in parallel at every time shown in FIG. 1.

The storing module used for storing the system bit data is mainly used to store the system bit data according to the control of the controlling module, wherein when the storing module uses the single port storage, the number of the single port storages used for storing the system bit data is equal to the set parallelism degree; when the storing module uses the real dual-port storage, the number of the real dual-port storages used for storing the system bit data is equal to one half of the set parallelism degree.

The storing module used for storing the check data is mainly used to store the check data according to the control of the controlling module, wherein when the storing module uses the single port storage, the number of the single port storages used for storing the check data is equal to the set parallelism degree; when the storing module uses the real dual-port storage, the number of the real dual-port storages is equal to one half of the set parallelism degree.

The puncturing module is mainly used to take out the number parameter configuration according to the initial parameter and the end parameter, read the data from the storage, and judge whether the read data are invalid data, and if yes, delete the invalid data, or else, output the data, and when the taken data are still not enough when the reading the data the end parameter position, then continue to read data from the first position of the storage until obtaining enough data.

In other embodiment, the above system may comprise 2N parallel interleaving address calculating modules, and at this point, the N interleaving address calculating modules are dedicated to process the input N system bit data in parallel, and the other N interleaving address calculating modules are dedicated to process the input N corresponding data groups in parallel.

Figure 6:
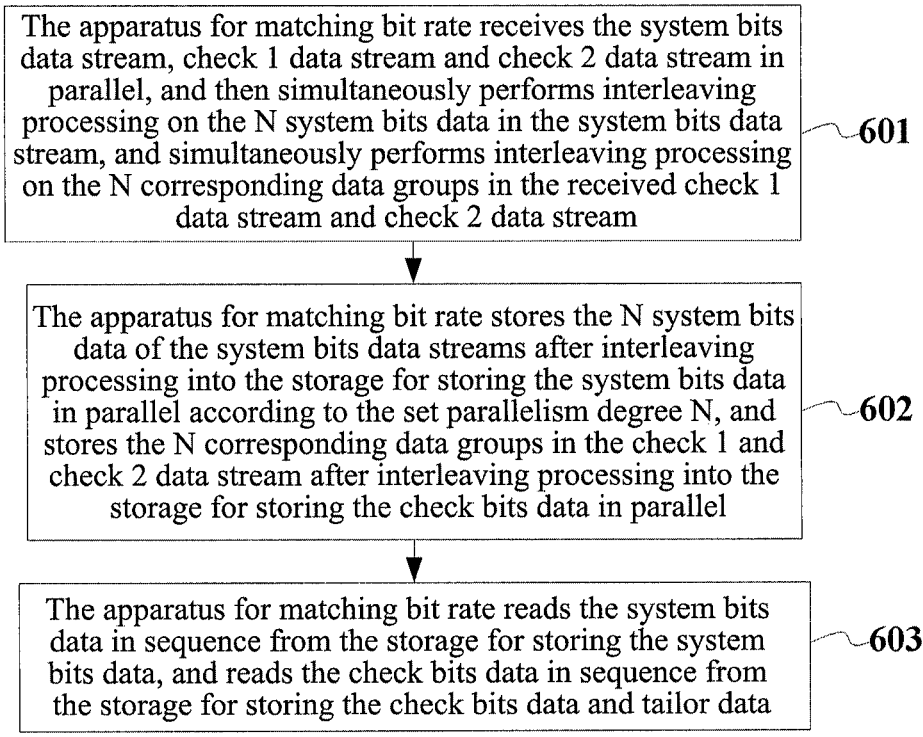
FIG. 6 is a flowchart of implementing the bit rate matching by the apparatus shown in FIG. 5.

The following will illustrate the set parallelism degree of 4, the specific parallel processing process of the bit rate matching implemented by the above apparatus, and as shown in FIG. 6, the process comprises the following steps.

Step 601: the parallel processing apparatus of bit rate matching receives the system bit data stream, check 1 data stream and check 2 data stream in parallel, and then simultaneously performs interleaving processing on the N system bit data in the received system bit data stream, and simultaneously performs interleaving processing on the N corresponding data groups in the received check 1 data stream and check 2 data stream.

In this step, the corresponding data group in the check 1 data stream and the check 2 data stream refers to: the first data to the last but one data in check 1 data stream constitute the corresponding data with the second data to the last data in check 2 data stream respectively, the last data in the check 1 data stream constitutes the corresponding data with the NULL padded in the check 2 data stream, and the first data in check 2 data stream constitutes the corresponding data with the NULL padded in the check 1 data stream; wherein each of the corresponding data groups can be taken as one data to perform the interleaving processing.

In this embodiment, the received input check 1 data stream and check 2 data stream may be cached respectively, that is, buffer 1 and buffer 2 may be allocated for the check 1 data stream, and a cache and a buffer 1 may be allocated for the check 2 data stream; the received check 1 data go into the buffer 1 firstly and then go into buffer 2, the first data in the received check 2 data stream is cached in the cache, the data starting from the second data in the received check 2 data stream all go into the buffer 1, and thus, the data in the buffer 2 of the check 1 data stream and the data in the buffer 1 of the check 2 data stream are corresponding data; then interleaving processing can be just performed on the corresponding data simultaneously according to the interleaving formula, and when there are no more data cached in the buffer 1 of the check 2 data stream (that is, all of the data of the check 2 data stream are all received), it is started to pad the set number of NULLs for the check 2 data stream, therefore, the data in the buffer 1 of the check 1 data stream (i.e., the last data in the received check 1 data stream) just constitutes corresponding data with the NULLs padded in the check 2 data stream, and after the last data of the check 1 data stream constituting the corresponding data group with the NULLs padded in the check 1 data stream, it is started to pad the set number of NULLs for the check 1 data stream; at this point, when the number of the NULLs padded for the check 1 data stream reaches a set value (that is, when padding the last NULL), the data (namely the first data in the received check 2 data stream) cached in the cache just constitute the corresponding data with the NULLs padded in the check 1 data stream, and interleaving processing is performed on all of the constituted N corresponding data groups simultaneously according to the interleaving formula until all the corresponding data group are processed, wherein when performing interleaving processing on each corresponding data group, this corresponding data group can be regarded as one data for processing.

Step 602: the parallel processing apparatus of bit rate matching stores the N system bit data of the system bit data streams on which the interleaving processing is performed into the storage used for storing the system bit data in parallel according to the set parallelism degree N, and stores the N corresponding data groups in the check 1 and check 2 data stream on which the interleaving processing is performed into the storage used for storing the check bit data in parallel, wherein the storage used for storing the system bit data is a storage with one data bit-width, and the storage used for storing the check bit data is a storage with two data bit-width.

In this embodiment, the description takes the parallelism degree 4 as example according to the interleaving function law in the protocol: the interleaving function in the protocol is transformed into the following form of the 4×8 matrix:

0, 16, 8, 24, 4, 20, 12, 28,
2, 18, 10, 26, 6, 22, 14, 30,
1, 17, 9, 25, 5, 21, 13, 29,
3, 19, 11, 27, 7, 23, 15, 31

Because the parallelism degree is 4, the number of the added NULLs during the rate matching is an integral multiple of 4 when four data are coming at the same time, and therefore it is necessary to start from the first row of the interleaving matrix, the second data is in the third row, the third data is in the second row, the last data is in the fourth row, and the like, then the data may be stored in four storages respectively, and each storage stores 8 columns of data; specifically, a storage pattern is written according to the parallelism degree, and the successive column numbers are stored in different storages based on the column interleaving way provided in the TABLE 1 according to the parallelism degree requirement, wherein each storage stores one column of the successive column numbers.

Step 603: the parallel processing apparatus of bit rate matching reads the system bit data in sequence from the storage used for storing the system bit data, and reads the check bit data in sequence from the storage used for storing the check bit data, and tailors the data.

Of course, the storage used for storing the system bit data may also adopt a real dual-port storage, and at this point, the number of the real dual-port storages is one half of the set parallelism degree. Besides, since the interleaving addresses of each data are different, there will not be an address conflict occurring in the real dual-port storages.

In other application scenarios, the set parallelism degree may be any one from 2 to 32 bits, and when the parallelism degree is 2, the storage pattern determined by the parallel processing apparatus of bit rate matching is as follows:

0, 16, 8, 24, 4, 20, 12, 28, 2, 18, 10, 26, 6, 22, 14, 30,
1, 17, 9, 25, 5, 21, 13, 29, 3, 19, 11, 27, 7, 23, 15, 31

When the parallelism degree is 3, the storage pattern determined by the parallel processing apparatus of bit rate matching is as follows:

0, 16, 8, 24, 4, 20, 12, 28,
2, 18, 10, 26, 6, 22, 14, 30,
1, 17, 9, 25, 5, 21, 13, 29, 3, 19, 11, 27, 7, 23, 15, 31

It can be seen from the above embodiment that the technical scheme of the present invention uniformly stores the input data according to the required parallel degree, thereby increasing the system throughput. Meanwhile, the technical scheme of the present invention implements the interleaving storage when storing the check 1 and check 2, thereby simplifying the storage structure and decreasing the system complexity.

Of course, there may also be other various embodiments, and those skilled in the art may make various corresponding changes and variations to the present invention without departing from the spirit and substance of the present invention, these corresponding changes and variations, however, should fall into the protection scope of the accompanied claims.

INDUSTRIAL APPLICABILITY

Compared with the existing bit rate matching scheme, the technical scheme of the present invention implements the interleaving storage when storing the check 1 data stream and check 2 data stream, thereby simplifying the storage structure and decreasing the system complexity.

Furthermore, the serial processing of bit rate matching according to the technical scheme of the present invention uniformly stores the system bit data and the check data, and reading the data in parallel thus is very easy, which facilitates the implementation of the puncturing in parallel and improves the processing rate of the rate matching. In addition, since the storage interfaces are decreased in the present scheme, the implementation steps of the hardware are simplified, the power consumption and area are saved, and costs are reduced; the parallel processing of bit rate matching according to the technical scheme of the present invention improves the system processing capability.

What is claimed is:

1. A parallel processing method of bit rate matching, comprising:
receiving a system bit data stream, a check 1 data stream and a check 2 data stream, performing interleaving processing on N system bit data in the received system bit data stream, and caching the N system bit data in a storage used for storing the system bit data in parallel;
respectively constituting corresponding data with data in the check 1 data stream and data in the check 2 data stream; wherein the corresponding data refers to: a first data to a last but one data in the check 1 data stream respectively corresponding with a second data to a last data in the check 2 data stream; a last data in the check 1 data stream corresponding with a NULL padded in the check 2 data stream, and a first data in the check 2 data stream corresponding with a NULL padded in the check 1 data stream;
performing interleaving processing on the corresponding data and caching the corresponding data in a storage used for storing the check bit data in parallel with a parallelism degree of N, until all of the corresponding data are processed, wherein each corresponding data is regarded as one data for interleaving processing by a same interleaving address generation;
reading valid data from the storage used for storing the system bit data and the storage used for storing the check bit data, and implementing the rate matching.

2. The method according to claim 1, wherein
the step of reading valid data from the storage used for storing the system bit data and the storage used for storing the check bit data comprises:
according to a set address and a length of output data, reading valid system bit data in parallel from the storage used for storing the system bit data, and reading valid check bit data in parallel from the storage used for storing the check bits data.

3. The method according to claim 2, wherein
when the storage used for storing system bit data is a single port storage, a number of the storages used for storing the system bit data is equal to a set parallelism degree;
when the storage used for storing the system bit data is a real dual-port storage, a number of the storages used for storing the system bit data is equal to one half of the set parallelism degree.

4. The method according to claim 2, wherein
when the storage used for storing check data is a single port storage, a number of the storages used for storing the check data is equal to a set parallelism degree;
when the storage used for storing check data is a real dual-port storage, a number of the storages used for storing the check bits data is equal to one half of the set parallelism degree.

5. A parallel process apparatus of bit rate matching, comprising a controlling module, N interleaving address calculating modules and a puncturing module, wherein N is equal to a preset parallelism degree; wherein
the controlling module is configured to: control the N interleaving address calculating modules to perform interleaving processing on N system bit data in a received system data stream, and cache the N system bit data on which the interleaving processing is performed in a storage used for storing system bit data in parallel; and is further configured to respectively constitute the corresponding data with data in the check 1 data stream and data in the check 2 data stream; wherein the corresponding data refers to: a first data to a last but one data in the check 1 data stream respectively corresponding with a second data to a last data in the check 2 data stream; a last data in the check 1 data stream corresponding with a NULL padded in the check 2 data stream, and a first data in the check 2 data stream corresponding with a NULL padded in the check 1 data stream; and moreover is configured to control the N interleaving address calculating modules to perform interleaving processing on the corresponding data, and cache the N corresponding data with a parallelism degree of N on a storage used for storing check data in parallel;
the interleaving address calculating module is configured to: perform interleaving processing on system bit data according to control of the controlling module, and perform interleaving processing on the corresponding data with a parallelism degree of N until all of the corresponding data is processed; wherein each corresponding data is regarded as one data for interleaving processing by a same interleaving address generation device to process interleaving;

the puncturing module is configured to: read valid data from the storage used for storing the system bit data and the storage used for storing the check data, and implement the rate matching.

6. The apparatus according to claim 5, wherein the puncturing module is also configured to: read valid system bit data in parallel from the storage used for storing the system bit data, and read valid check data in parallel from the storage used for storing the check data.

7. The apparatus according to claim 6, wherein when the storage used for storing the system bit data is a single port storage, a number of the storages used for storing the system bit data is equal to a set parallelism degree;

when the storage used for storing the system bit data a dual-port storage, a number of the storages used for storing the system bit data is equal to one half of the set parallelism degree.

8. The apparatus according to claim 6, wherein, when the storage used for storing the check data is a single port storage, a number of the storages used for storing the check data is equal to a set parallelism degree;

when the storage used for storing the check data is a dual-port storage, a number of the storages used for storing the check data is equal to one half of a set parallelism degree.

* * * * *